（12） United States Patent
Patel et al.

(10) Patent No.: US 8,024,507 B2
(45) Date of Patent: Sep. 20, 2011

(54) TRANSACTION-SAFE FAT FILE SYSTEM IMPROVEMENTS

(75) Inventors: Sachin Patel, Bellevue, WA (US); Yadhu N. Gopalan, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 723 days.

(21) Appl. No.: 12/057,023

(22) Filed: Mar. 27, 2008

(65) Prior Publication Data

US 2008/0177939 A1 Jul. 24, 2008

Related U.S. Application Data

(60) Division of application No. 10/876,425, filed on Jun. 25, 2004, now Pat. No. 7,363,540, which is a continuation-in-part of application No. 10/431,009, filed on May 7, 2003, now Pat. No. 7,174,420.

(60) Provisional application No. 60/420,541, filed on Oct. 22, 2002.

(51) Int. Cl.
*G06F 12/00* (2006.01)
(52) U.S. Cl. .................. 711/102; 711/154; 711/E12.001
(58) Field of Classification Search .................. None
See application file for complete search history.

(56) References Cited

U.S. PATENT DOCUMENTS

| 5,086,502 | A | | 2/1992 | Malcolm |
| 5,201,044 | A | | 4/1993 | Frey, Jr. et al. |
| 5,297,148 | A | * | 3/1994 | Harari et al. .................. 714/710 |
| 5,469,562 | A | | 11/1995 | Saether |
| 5,537,636 | A | | 7/1996 | Uchida et al. |
| 5,546,389 | A | | 8/1996 | Wippenbeck et al. |
| 5,574,907 | A | * | 11/1996 | Jernigan et al. .................. 1/1 |
| 5,699,548 | A | | 12/1997 | Choudhury et al. |
| 5,732,268 | A | | 3/1998 | Bizzarri |
| 5,734,340 | A | | 3/1998 | Kennedy |
| 5,778,168 | A | | 7/1998 | Fuller |
| 5,813,011 | A | | 9/1998 | Yoshida et al. |
| 5,825,734 | A | | 10/1998 | Igarashi et al. |
| 5,832,515 | A | | 11/1998 | Ledain et al. |
| 5,850,506 | A | | 12/1998 | Gordons |
| 5,907,672 | A | | 5/1999 | Matze et al. |
| 5,983,240 | A | | 11/1999 | Shoroff et al. |
| 6,023,744 | A | | 2/2000 | Shoroff |
| 6,032,223 | A | | 2/2000 | Beelitz |
| 6,037,738 | A | | 3/2000 | Morita et al. |
| 6,049,807 | A | | 4/2000 | Carroll et al. |
| 6,078,999 | A | | 6/2000 | Raju et al. |
| 6,108,759 | A | | 8/2000 | Orcutt |
| 6,192,432 | B1 | | 2/2001 | Slivka et al. |

(Continued)

OTHER PUBLICATIONS

Farr, et al., "An Optimum Disc Organization for a Virtual Memory System", Computer Design, Jun. 1971, pp. 49-54.

(Continued)

*Primary Examiner* — Reginald G Bragdon
*Assistant Examiner* — Eric Loonan

(57) ABSTRACT

Concepts for enhancing operation of transaction-safe file allocation table systems are described. The concepts include writing a file to non-volatile memory media and rendering an update of file size to the TFAT storage medium; and receiving a request to locate data in a non-volatile memory having a TFAT file management system, selecting a sector of the memory to parse to locate the data, determining when the selected sector is a first sector of a directory or subdirectory of the memory and when determining reveals that the selected sector is a first sector, skipping reading data from the selected sector. The concepts also include flushing a cache and synchronizing FATs.

20 Claims, 9 Drawing Sheets

U.S. PATENT DOCUMENTS

| | | |
|---|---|---|
| 6,205,558 B1 | 3/2001 | Sobel |
| 6,286,113 B1 | 9/2001 | Sembach et al. |
| 6,374,268 B1 | 4/2002 | Testardi |
| 6,377,958 B1 | 4/2002 | Orcutt |
| 6,378,031 B1 | 4/2002 | Kuno et al. |
| 6,470,345 B1 | 10/2002 | Doutre et al. |
| 6,510,552 B1 | 1/2003 | Benayoun et al. |
| 6,529,966 B1 | 3/2003 | Willman et al. |
| 6,571,259 B1 | 5/2003 | Zheng et al. |
| 6,594,725 B2 | 7/2003 | Ando et al. |
| 6,615,365 B1 | 9/2003 | Jenevein et al. |
| 6,615,404 B1 | 9/2003 | Garfunkel et al. |
| 6,658,437 B1 | 12/2003 | Lehman |
| 6,662,309 B2 | 12/2003 | Ando et al. |
| 6,675,180 B2 | 1/2004 | Yamashita |
| 6,792,518 B2 | 9/2004 | Armangau et al. |
| 6,856,993 B1 | 2/2005 | Verma et al. |
| 6,883,114 B2 | 4/2005 | Lasser |
| 6,907,184 B1 | 6/2005 | Yokota et al. |
| 6,922,708 B1 | 7/2005 | Sedlar |
| 7,051,251 B2 | 5/2006 | Moore et al. |
| 7,062,602 B1 | 6/2006 | Moore et al. |
| 7,089,448 B2 | 8/2006 | Hinshaw et al. |
| 7,174,420 B2 | 2/2007 | Malueg et al. |
| 7,363,540 B2 | 4/2008 | Patel et al. |
| 7,613,738 B2 | 11/2009 | Patel et al. |
| 7,685,171 B1 | 3/2010 | Beaverson et al. |
| 7,747,664 B2 | 6/2010 | Patel et al. |
| 2001/0016841 A1 | 8/2001 | Karasudani |
| 2001/0054129 A1 | 12/2001 | Wouters |
| 2002/0152354 A1 | 10/2002 | Harmer |
| 2003/0028765 A1 | 2/2003 | Cromer et al. |
| 2003/0233385 A1 | 12/2003 | Srinivasa |
| 2004/0030847 A1 | 2/2004 | Tremaine |
| 2004/0078704 A1 | 4/2004 | Malueg et al. |
| 2004/0210706 A1 | 10/2004 | In et al. |
| 2004/0250172 A1 | 12/2004 | Patel et al. |
| 2005/0027746 A1 | 2/2005 | Lin et al. |
| 2005/0060316 A1 | 3/2005 | Kamath et al. |
| 2006/0020745 A1 | 1/2006 | Conley et al. |
| 2007/0136387 A1 | 6/2007 | Malueg et al. |
| 2007/0239957 A1 | 10/2007 | Lin |
| 2008/0172425 A1 | 7/2008 | Patel et al. |
| 2008/0172426 A1 | 7/2008 | Patel et al. |
| 2010/0049776 A1 | 2/2010 | Patel et al. |

OTHER PUBLICATIONS

Microsoft Press Computer Dictionary 3rd Edition, "flush", Microsoft Press, 1997, pp. 202.

Microsoft Press Computer Dictionary 3rd Edition, "fragmentation", Microsoft Press, 1997, pp. 206.

Jonge, et al., "The Logical Disk: A New Approach to Improving File Systems", ACM, 1993, pp. 15-28.

Lee, "Server-Based Maintenance Approach for Computer Classroom Workstations", IEICE TRANS. INF. & SYST., vol. E83-D, No. 4, Apr. 2000, pp. 807-815.

"Transactional file access", Date: Jun. 2, 2005, http://jakarta.apache.org/commons/transaction/file/index.html.

"ZFS, Sun's Cutting-Edge File System (Part 1: Storage Integrity, Security, and Scalability)", Date: Aug. 2006, http://www.sun.com/bigadmin/features/articles/zfs.sub.part1.scalable.html#transaction.

Kashyap, Aditya, "File System Extensibility and Reliability Using an in-Kernel Database", Date: Dec. 2004, http://www.am-utils.org/docs/kbdbfs-msthesis/index.html.

"Transaction-Safe FAT File System", http://msdn.microsoft.com/library/default.asp?url=/library/en-us/wcemain4/html/cmcontransaction-safefatfilesystem.asp, last updated May 30, 2006.

Sivathanu et al., "Life or Death at Block-Level", In Proceedings of the 6th Symposium on Operating Systems Design and Implementation (OSDI '04), Dec. 2004.

Chen, et al., "The Rio File Cache: Surviving Operating System Crashes", Date: Oct. 1996, http://www.cs.ucsd.edu/classes/wi01/cse221/chen,ng,rajamani,aycock.the__rio-file__cache.surviving__operating__system__crashes.pdf.

Barreto et al., "A Highly Available Replicated File System for Resource-Constrained Windows CE .Net Devices", In 3rd International Conference on .Net Technologies, May 2005.

Otoo et al., "Non-shared disk cluster—a fault tolerant, commodity approach to hi-bandwidth data analysis", Sep. 2001, available at http://www.ihep.ac.cn/~chep01/paper/4-026.pdf.

* cited by examiner

TRANSACTION-SAFE FAT FILE SYSTEM IMPROVEMENTS

RELATED APPLICATIONS

This application is a division of U.S. patent application Ser. No. 10/876,425, filed on Jun. 25, 2004 and issued as U.S. Pat. No. 7,363,540 on Apr. 22, 2008, entitled "Transaction-Safe FAT Files System", which in turn is a continuation-in-part of U.S. patent application Ser. No. 10/431,009, filed on May 7, 2003 and issued as U.S. Pat. No. 7,174,420 on Feb. 6, 2007, entitled "Transaction-Safe FAT Files System", which claims the benefit of U.S. Provisional Application No. 60/420,541, filed on Oct. 22, 2002, entitled "Transaction-Safe FAT Files Subsystem", listing Michael D. Malueg, Hang Li, Yadhu N. Gopalan, Ronald O. Radko, Daniel J. Polivy, Sharon Drasnin, Jason R. Farmer and DaiQian Huang as inventors, which is hereby incorporated by reference.

TECHNICAL FIELD

This disclosure relates to Transaction-safe File Allocation Table (TFAT) file systems designed to reduce the probability that a computer file system becomes corrupted in the event of power loss during a write cycle, and, more particularly, to TFAT file systems capable of restoring system settings in the event of a power-on-reset (POR) event.

BACKGROUND

Computer systems employ multiple memory types, including ROM, volatile rapid access memories and non-volatile memories. ROM may be used to implement a basic input output system (a.k.a. BIOS) by having a power on reset circuit that causes the information stored in the ROM to be read and employed by a processor when the power is reset to the computer system. This is an example of a non-volatile memory, or a memory that retains stored data even when no electrical power is being supplied to the computer system.

Volatile rapid access memories, such as cache memories and dynamic random access memories (DRAMs), are used to store information elements such as data and instructions, and especially those information elements that are repeatedly needed by the processor. Volatile memories are incapable of storing data for any significant period of time in the absence of externally-supplied electrical power.

Computer systems typically include multiple non-volatile memory devices, which have evolved from punch card decks and paper tape systems, through large magnetic disc systems to include compact disc memories, floppy discs, small, high capacity disc systems, flash memory systems and other forms of non-volatile data storage devices.

Disc drive data storage systems are typically much slower than many other types of memory but provide high data storage capacity in a relatively attractive form factor and at a relatively low cost per stored bit. These types of memories include electromechanical components, and, accordingly, are limited in speed of operation. As a result, the probability that a power interruption may occur when data are being written to the memory device is increased, relative to some other types of memory. In order to be able to determine which data were written to the disc, and to be able to determine where on the disc the stored data are located, a file allocation table (FAT) system is employed. Several different kinds of FATs have been developed, including FAT12, 16 and 32, to address needs of different systems.

In a conventional FAT file system, when a file is modified, new data or changes to an existing file are written over and/or appended to a previous version of the file. Additionally, a log file is created of operations that will involve writing data to the non-volatile data storage device. Following writing of the new data or changes, the FAT is updated and the log is erased. Such FAT file systems track completed transactions, and are called "transactioned" file systems.

The conventional FAT file system is vulnerable to corruption from a "torn write", e.g., a write operation that is interrupted such as by an intervening power loss, or when storage media are disconnected during a write, because of the procedure used to store data. Should power fail after initiation of a write of new data to a file, but before or during the corresponding FAT write operation, the entire file system can be damaged or destroyed. While the likelihood of complete file system loss is small, there is a large probability of lost cluster chains that will require some form of servicing by a utility such as scandisk or chkdsk.

FAT file systems by design are not transaction-safe file systems. The FAT file system can be corrupted when a write operation is interrupted during a write transaction (a "torn write") due to power loss or removal of the storage medium. The FAT is corrupted when the contents of the FAT do not agree with the contents of the directory or data sections of the volume. When this happens, the user will lose some data.

Even when transaction-safe capabilities are included by, for example, use of multiple FATs, together with tracking to ensure that the last good FAT and last good data are identified or identifiable, the system typically reverts to factory or default settings. In other words, the user selections for configuration settings, network settings, email settings and the like may be replaced with default settings and thus need to be reset by the user after a POR event.

This is not desirable in certain computer systems, such as those embedded computer systems where the data integrity is a high priority requirement. In order to reduce these data corruption issues, a new FAT solution is needed for such computer systems that also allows existing systems to access the storage medium and that is compatible with existing systems.

SUMMARY

In one aspect, the present disclosure describes a process for maintaining multiple transaction-safe file allocation tables (TFATs) for a volume of TFAT storage medium. The process includes acts of writing a file to non-volatile memory media and rendering an update of file size to the TFAT storage medium.

In another aspect, the present disclosure describes one or more computer readable media having stored thereon a plurality of instructions that, when executed by one or more processors, causes the one or more processors to modify data represented by at least a first sector on a storage medium such that the one or more processors perform acts including receiving a request to locate data in a non-volatile memory having a TFAT file management system and selecting a sector of the memory to parse to locate the data. The instructions are also configured to cause the one or more processors to perform acts of determining when the selected sector is a first sector of a directory or subdirectory of the memory, and, when determining reveals that the selected sector is a first sector, skipping reading data from the selected sector.

In a further aspect, the present disclosure describes a process for maintaining transaction-safe file allocation tables (TFATs) for a volume of TFAT storage medium. The process includes acts of determining when a write request includes need for writing new data over at least a portion of an entire cluster; and, when determining indicates that the entire cluster will be rewritten, the process further includes acts of locating a new cluster location and writing the new data over the new cluster without first re-writing old data in the new cluster location.

In an additional aspect, the present disclosure contemplates computer readable media including computer-readable instructions configured to cause one or more processors to open a file for writing in a write-through mode, first write a first page of data to a first location in the file within a TFAT volume and, second write a second page of data to a second location in the file within the TFAT volume, wherein the first and second write comprise an atomic write.

BRIEF DESCRIPTION OF THE CONTENTS

DETAILED DESCRIPTION

Figure 1A:
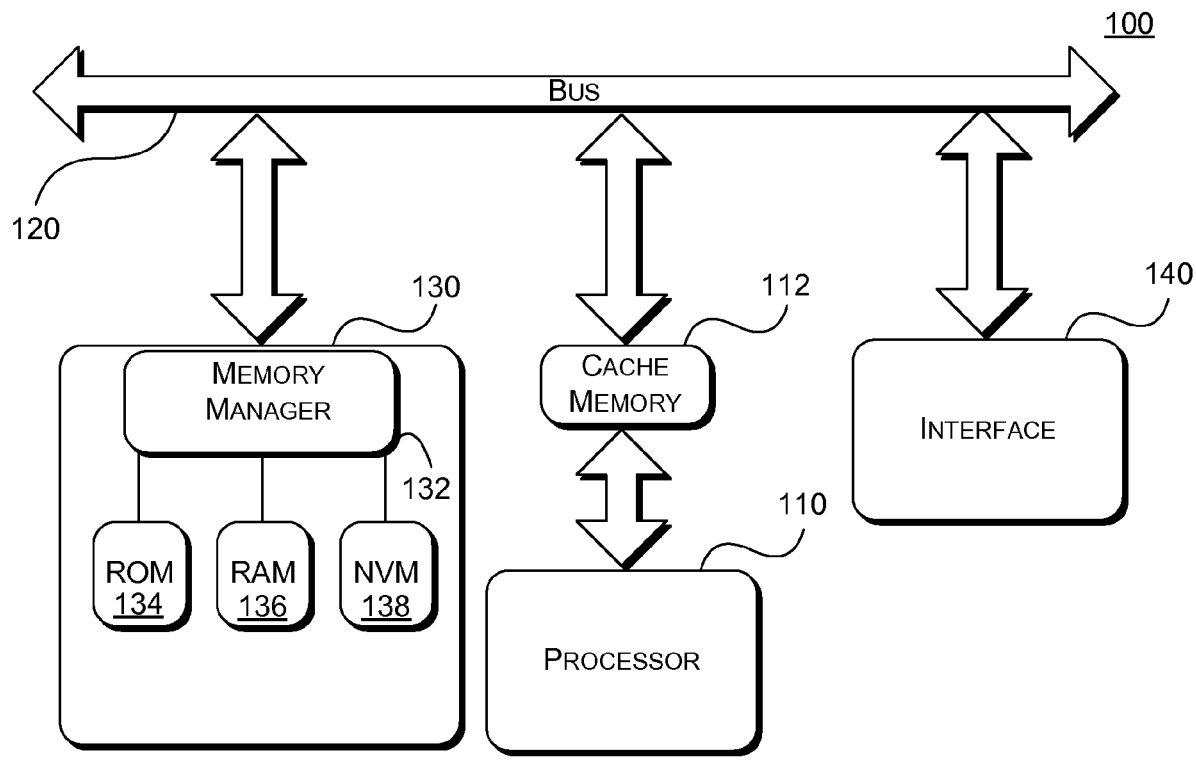
FIG. 1A is a block diagram of an exemplary embedded computer system including non-volatile memory.

FIG. 1A is a block diagram of a representative computer system 100. In one embodiment, the computer system 100 is embedded within an appliance or vehicle (not illustrated) and facilitates control of various subsystems, coordination between subsystems, data and usage logging and also facilitates interfacing with external computer devices (not shown). The computer system 100 includes a processor 110, a cache memory 112, a bus 120 coupled to the processor 110 and a memory system 130 coupled to the bus 120. The memory system 130 typically includes a memory management unit 132 coupled to the bus 120 and to ROM 134, temporary storage memory 138 such as DRAM or SRAM and non-volatile memory 138.

The cache memory 112 typically employs a limited amount of high-speed memory to facilitate rapid operation of the process 110. For example, the cache memory may store frequently-accessed information and/or instructions, or may provide a way for the processor to rapidly write data for later incorporation into a slower portion of memory as the processor executes other tasks.

Non-volatile memory 138 may include non-removable media, which may include NAND/NOR flash memory and hard drives. Non-volatile memory 138 may also include removable media, such as Compact-Flash (CF) cards, Secure-Digital (SD) cards, magnetic or optical discs and other removable mass storage devices.

Discs are typically organized into portions known as "clusters" that are differentiated by addresses. A cluster is a sequence of contiguous sectors or linked sectors representing portions of a disc, for example. A cluster is defined as a group of 1 or more sectors and is determined during formatting. When a file is written to the disc, it may be written to one cluster or it may require several clusters. The several clusters containing data representing a file may be contiguous but often are not. As a result, it is necessary to have a master list of the clusters into which a given file is written and for the list to provide the order in which the clusters are organized. Such a list is referred to as a "chain" of clusters. A group of such lists form a portion of the TFAT. The TFAT thus is a tool for data retrieval that permits data to be read from the storage medium in an organized manner. Other types of storage media may be organized to mimic the organization of a disc in order to be able to be accessed intelligibly by modules that are based on a disc model.

Computer system 100 typically includes at least some form of computer readable media. Computer readable media can be any available media that can be accessed by computer 100. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information and which can be accessed by computer system 100. Communication media typically embodies computer readable instructions, data structures, program logic or program modules or other data in a modulated data signal such as a carrier wave or other transport mechanism and includes any information delivery media.

The term "modulated data signal" means a signal that has one or more of its characteristics set or changed in such a manner as to encode information in the signal. By way of example, and not limitation, communication media includes wired media such as wired network or direct-wired connection, and wireless media such as acoustic, RF, infrared and other wireless media. Any of the above or combinations of any of the above should also be included within the scope of computer readable media.

The computer system 100 also includes one or more interfaces 140. Interfaces 140 may permit the computer system 100 to accept user input, for example via a keyboard, voice control, touch screen or other tactile, auditory, electrical or optical input device, and may permit information to be passed to a user via auditory or optical devices. Interfaces 140 may also couple the computer system 100 to an appliance (not illustrated), such as a global positioning system, or to a vehicle, or to other types of systems such as the Internet or other communications systems.

Interfaces 140 may also allow external computer systems (not shown) to interact with the computer system 100. For example, data such as accumulated distance traveled, service logs, malfunction logs applicable to associated subsystems, positional data describing historical performance data relevant to the computer system 100 and/or associated equipment and the like may be accessible to external computers via an interface 140. Similarly, modifications or upgrades to software associated with the computer system 100 may be coupled to the computer system 100 via an interface 140. Such could find utility in a vehicular application of the computer system 100, for example.

Alternatively, a removable portion of the non-volatile memory 138 may be decoupled from the computer system 100, temporarily or permanently, and interfaced with an external computer system (not shown), or vice versa. In either case, it is important to have some commonality of memory system organization to allow either the external computer system or the processor 110 to be able to read and/or write data to the memory system 130 or a detachable component of the non-volatile memory 138.

Figure 1B:
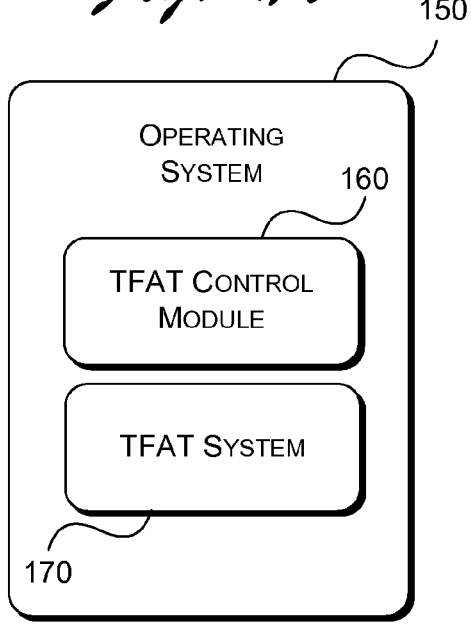
FIG. 1B is a block diagram representing an exemplary operating system and FAT file system suitable for use with the computer of FIG. 1A.

FIG. 1B is a block diagram showing an exemplary operating system 150 and TFAT file system 170 suitable for use with the computer 100 of FIG. 1A. The operating system 150 provides an environment in which applications may be employed by the computer 100. When the processor 110 encounters a write command, a TFAT control module 160 is invoked to cause the TFAT file system 170 coordinate with the write command as data are being written to the non-volatile memory 138.

Figure 2:
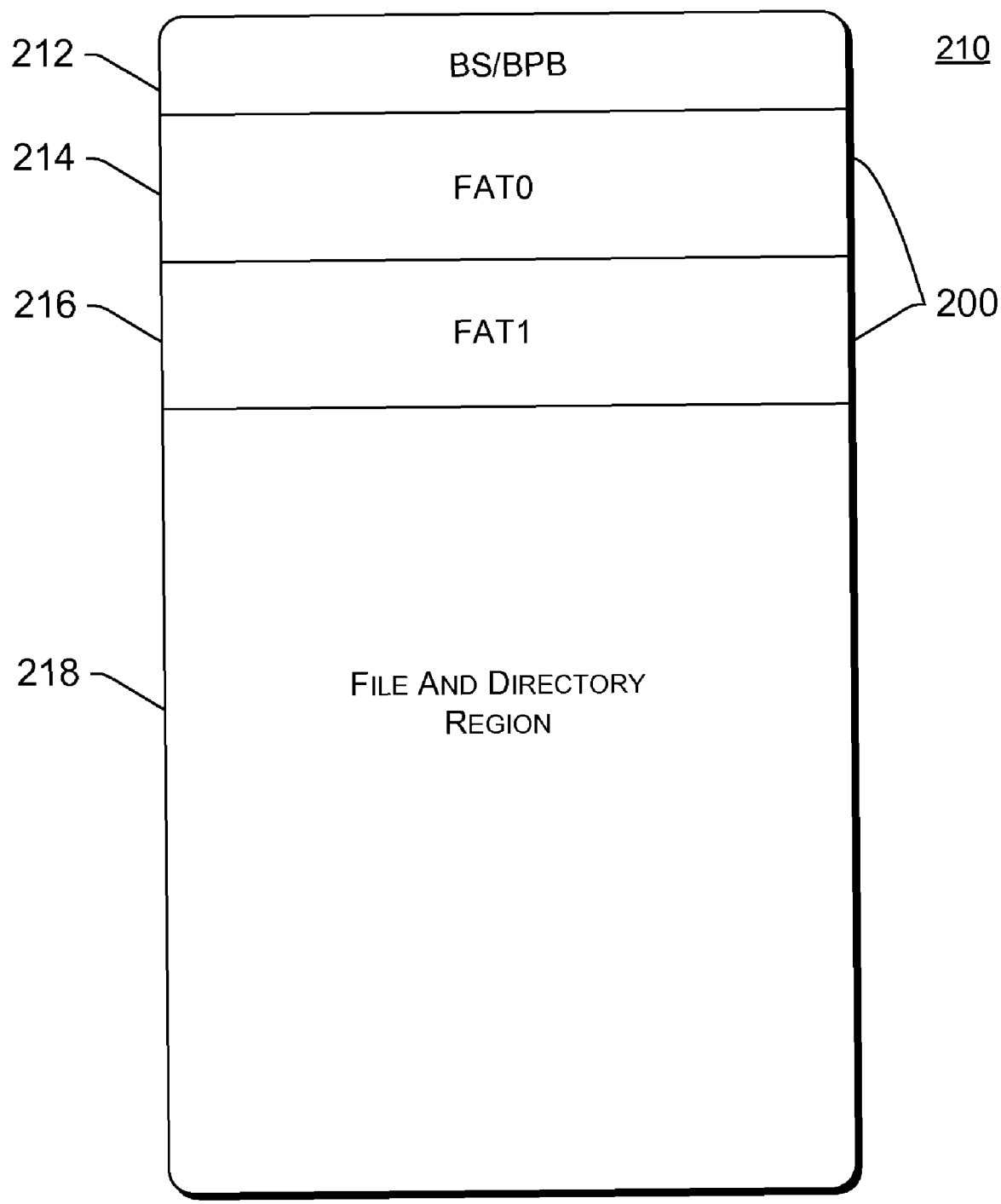
FIG. 2 is a block diagram representing an exemplary transaction-safe file allocation table (TFAT) file system implemented together with a volume of the non-volatile memory of FIG. 1A.

FIG. 2 is a block diagram representing an exemplary transaction-safe file allocation table (TFAT) system 200 (analogous to the TFAT file system 170 of FIG. 1B) implemented together with a volume 210 of the non-volatile memory 138 of FIG. 1A. The volume 210 includes a boot sector, BS/BPB 212, a first file allocation table FAT0 214, a second file allocation table FAT1 216 and a file and directory data region 218.

The following detailed description uses several terms of art. Definitions for some of these terms are given below.

STREAM. A stream is an abstraction of a file or directory and represents a continuous run of data, starting at offset 0, in one embodiment. Data can be read and written to the stream arbitrarily, and in arbitrary sizes by a file system. The file system maps the stream to the actual physical layout of the file on disk. An internal DSTREAM data structure stores information about the stream, and is often used in the file system code.

RUN. A run is a set of contiguous blocks of a file. Disk operations operate on contiguous data in a single operation. Accordingly, the run is an important part of all disk operations to a file or directory. The RUN data structure contains information about a run; the RUN structure stored in the DSTREAM contains information about the current run used in the last operation on the stream. The run usually contains information such as the starting and ending stream-relative offsets, and the volume-relative blocks corresponding to the offsets on disk.

Directory Entry (DIRENTRY). In one embodiment, DIRENTRY is a 32-byte structure. DIRENTRY contains information about a file or directory, and directories are composed of DIRENTRY structures. The internal DIRENTRY structure matches the format of the on-disk structure exactly.

BUFFER. A buffer is an internal data structure that is used to buffer data that has been read from non-volatile memory such as a disk. The BUF structure stores information pertinent to a buffer, such as its current status, volume-relative block number, and a pointer to the actual data. Unless stream I/O is done in individual block-size chunks, it goes through the buffer subsystem.

SID or Unique Stream Identifier. This is an internal data structure that represents a unique ID for internal stream structures. SIDs are used throughout the file system code as a means for identifying streams, and in file system notifications. The DSID structure contains the cluster of the directory which contains the stream's DIRENTRY, and the ordinal in the directory of the stream's DIRENTRY. In conventional FAT volumes, this is guaranteed to be unique for each file (stream), and to never change.

Conventional FAT file systems assume that the starting cluster of a directory will never change. As a result, such systems use the directory cluster numbers as part of Stream IDs (SID). In TFAT file systems, changes to the first cluster of a file/directory would also necessitate rewriting the directory entry, for reasons discussed in more detail below. If all directory entries were in the first clusters of their parents' streams, then these changes propagate all the way to the root (because each modification requires a write to a new cluster, and if it is the first cluster of a file/directory, the directory entry needs to be updated for that new cluster, and so on).

In many file systems, a conventional directory is merely a collection of 32-byte DIRENTRYs, one after another, starting with two special system directory entries that are typically represented as '.' ("dot") and '..' ("dot dot"). In a conventional FAT file system, these two system directory entries are associated with each directory, subdirectory and file stored on the storage device, except the root directory. With respect to each directory or subdirectory, the "dot" entry points to a current sector where the directory or subdirectory is stored. The "dot dot" entry points to a parent directory.

In one embodiment of TFAT, a modified directory structure prevents any changeable data from being stored in the first cluster of a directory stream to prevent propagation of these first-cluster modifications. The modified directory structure is implemented with a process 300, discussed below with reference to FIG. 3A.

Figure 3A:
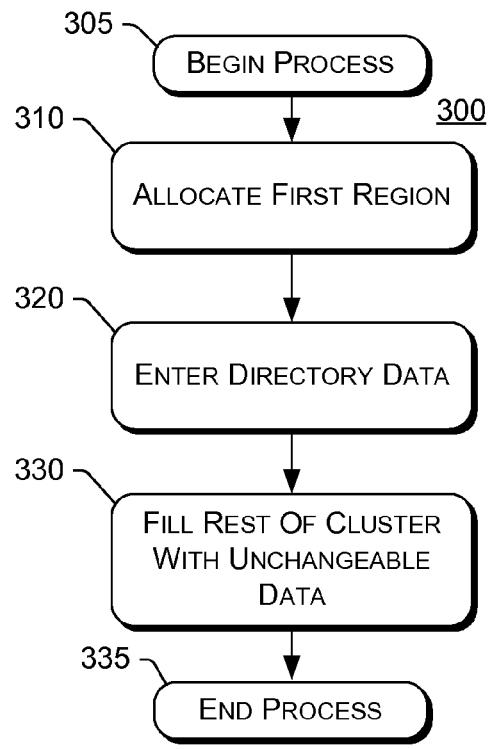
FIG. 3A is a flowchart of an exemplary process for creating directories and subdirectories that finds application with the TFAT file system of FIG. 2.

FIG. 3A is a flowchart of an exemplary process 300 for creating directories and subdirectories that finds application with the TFAT file system 200 of FIG. 2.

The process 300 begins in a block 305. Typically, the process 300 is initiated as a part of a memory write.

In a block 310, the process 300 allocates a first region of the non-volatile memory 138 of FIG. 1A. In one embodiment, such corresponds to allocating first and second clusters for a subdirectory.

The process 300 then enters data corresponding to a directory or a subdirectory into a first portion of the directory or subdirectory in a block 320. In one embodiment, such corresponds to a parent directory and to a sector corresponding to the associated directory or subdirectory, i.e., entries analogous to the '.' and '..' entries discussed above.

In a block 330, the process 300 fills a remainder of the first cluster with unchangeable data. In one embodiment, such unchangeable data comprises volume labels. The process 300 then ends in a block 335.

In many conventional file systems, a single cluster is allocated for each newly created directory. Note that the root directory is a special case, and does not have the '.' or '..' entries present.

In one embodiment of a TFAT volume, when a first cluster is allocated for a new directory or subdirectory, only two DIRENTRYs ('.' and '..' entries) are written when the new directory or subdirectory is created (block 310). The rest of the first cluster is filled (block 330) with data that are typically not overwritten by conventional system operations, i.e., data that are unchangeable. Examples of such data include volume labels.

In this embodiment, a second cluster is also allocated by TFAT (block 310) when the first cluster is allocated and written because the first cluster is already going to be filled (block 330). This embodiment requires a fixed overhead of an additional cluster for each directory. However, the performance gains obtained by not having propagating changes often outweigh the extra space required for each stored data file or subdirectory. In this embodiment, rewriting a directory entry does not cause changes to propagate up or down the directory hierarchy and instead requires relinking the FAT chain for the directory.

Because the first cluster is filled with unchanging data such as volume labels instead of other data that may be changeable, file systems such as those for desktop computers never access the data stored in the portion of the first cluster after the '.' and '..' files or accidentally delete those data. However, such directories cannot be deleted by such types of computers and file systems running on operating systems such as the family of Windows® operating systems produced by Microsoft Corporation for application in desktop computers.

Files added to this directory by desktop-type computers using conventional file systems will also not occupy the first cluster because the first directory cluster is filled with unchangeable data such as volume labels. When a conventional directory is created by such computers, the first cluster will not be filled with data such as volume labels. As a result, file write operations performed by such computers on such directories are not transaction-safe.

For FAT12 and FAT16 file systems, the root directory is in a fixed location on the storage medium and has a fixed size. In such systems, the first root directory cluster cannot be filled with data such as volume labels. In FAT32 file systems, the root directory need not have a fixed location or size, but none of these FAT file systems provide a root directory that is transaction-safe, i.e., one which can be moved or remapped without risk of corruption.

In one embodiment, TFAT employs a first root directory in the conventional location that includes a pointer to a first subdirectory (block 310), which then effectively becomes the working "root" directory. When portions of the first root directory other than the pointer are filled (block 330) with unchangeable data, the data in the first root directory never changes. As a result, the first root directory cannot be corrupted by interruption of a write cycle and thus is transaction-safe. When the first subdirectory is also configured such that the first cluster contains and ".." entries followed by unchangeable data, it also is transaction-safe. Additionally, this embodiment is backwards compatible with conventional FAT file systems.

However, the FindNext feature in many systems still searches through the data contained in sectors that include the "." and ".." entries. Thus, the FindNext feature may be improved in TFAT by not searching through the first cluster of each TFAT directory.

Figure 3B:
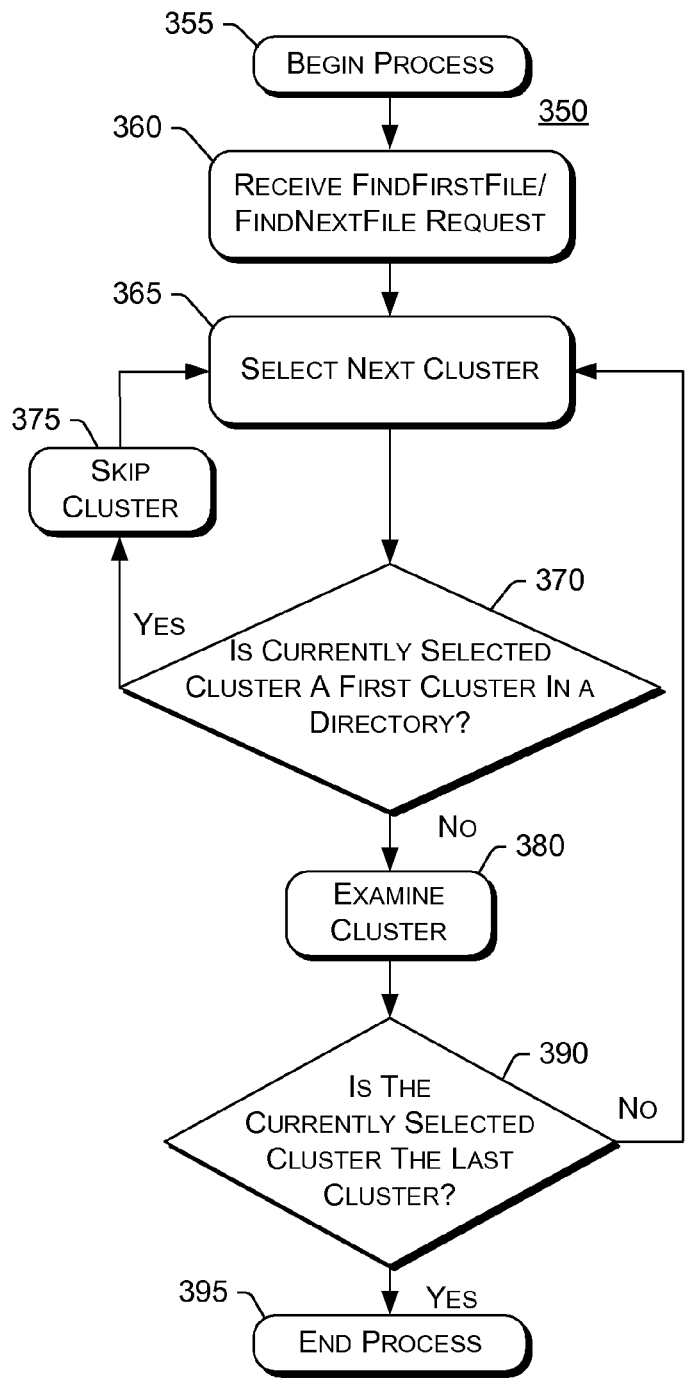
FIG. 3B is a flowchart of an exemplary process for parsing directories and subdirectories that finds application with the TFAT file system of FIG. 2.

FIG. 3B is a flowchart of an exemplary process 350 for parsing directories and subdirectories that finds application with the TFAT file system 200 of FIG. 2. The process 350 begins in a block 355.

In a block 360, the process 350 receives a request that requires searching of the memory. For example, the request may be a request to locate a file, such as a FindFirstFile request or a FindNextFile request. Servicing the request involves reading data from successive sectors of the memory in order to compare them to criteria associated with an objective of the search.

In a block 365, the process 350 selects a next cluster of the memory structure to parse in servicing the request. The next cluster is one that would, in conventional file systems, be read and then compared to criteria related to the search request in the course of the search.

In a query task 370, the process 350 determines when the selected cluster is a first cluster in a directory or subdirectory. When the process 350 determines that the selected cluster is a first cluster in a directory or subdirectory, control passes to a block 375. When the process 350 determines that the selected cluster is not a first cluster in a directory or subdirectory, control passes to a block 380. In the block 375, the entire selected first cluster of that directory is skipped. Control then passes back to the block 365.

In the block 380, the selected cluster is examined. Control then passes to a query task 390.

In the query task 390, the process 350 determines when the currently selected cluster is the last cluster to be searched. When the query task 390 determines that the selected cluster is the last cluster to be searched, control passes to a block 395. Determination that the currently selected cluster is that last cluster to be searched could result from location of the desired file or files, or from a determination that all applicable clusters have been searched. When the query task 390 determines that the selected cluster is not the last cluster to be searched, control passes back to the block 365.

In the block 395, the process 350 returns either a message indicating that the search criteria could not be satisfied or that the search criteria were satisfied. The process 350 then ends.

Every directory in TFAT contains a dummy cluster as the first cluster of the directory, so that the first cluster does not have to be transacted. By not transacting the first cluster, the complexity of transacting a directory can be reduced. Thus, an improvement that prevents the first cluster of the directory from being read when tasks are being executed that involve reading data from a cluster and then comparing the read data to some set of criteria, followed by iteration of these tasks on a subsequent cluster until the task criteria are satisfied, is desirable. Examples of such tasks include searching for files and subdirectories, such as to the FindFirstFile/FindNextFile features. This reduces the time required to execute these features, because this first cluster contains no information having utility for these purposes.

In one embodiment of TFAT, at least two file allocation tables (corresponding to FAT0 214 and FAT1 216 of FIG. 2) are maintained, with one being active and the other being non-active at any one time. When a change occurs to data stored on a mass non-volatile data storage device (e.g., NVM 138 of FIG. 1A) such as a magnetic disk, that change is recorded in the non-active FAT table. In one embodiment, one bit in a master boot record (MBR) controls which FAT table is active.

When the entire write is complete and the non-active FAT table is completely updated to reflect the completed write, the active FAT bit in the MBR is flipped and the previously non-active FAT becomes the active FAT. This newly active TFAT is then copied over the new non-active TFAT. TFAT will only guarantee that the file system will stay intact during power loss. When a write and TFAT update operation is not yet complete and an interruption occurs, data involved in that write operation may be lost and it is up to the application or user to address the data loss.

In one embodiment, the system maintains two FATs. A default TFAT write/file modification proceeds as follows. Initially the FATs are set up with FAT0 as a primary file allocation table and FAT1 as a secondary file allocation table. A write to a volume on a storage medium proceeds as described below with reference to process 400 as shown in the flowchart of FIG. 4.

Figure 4:
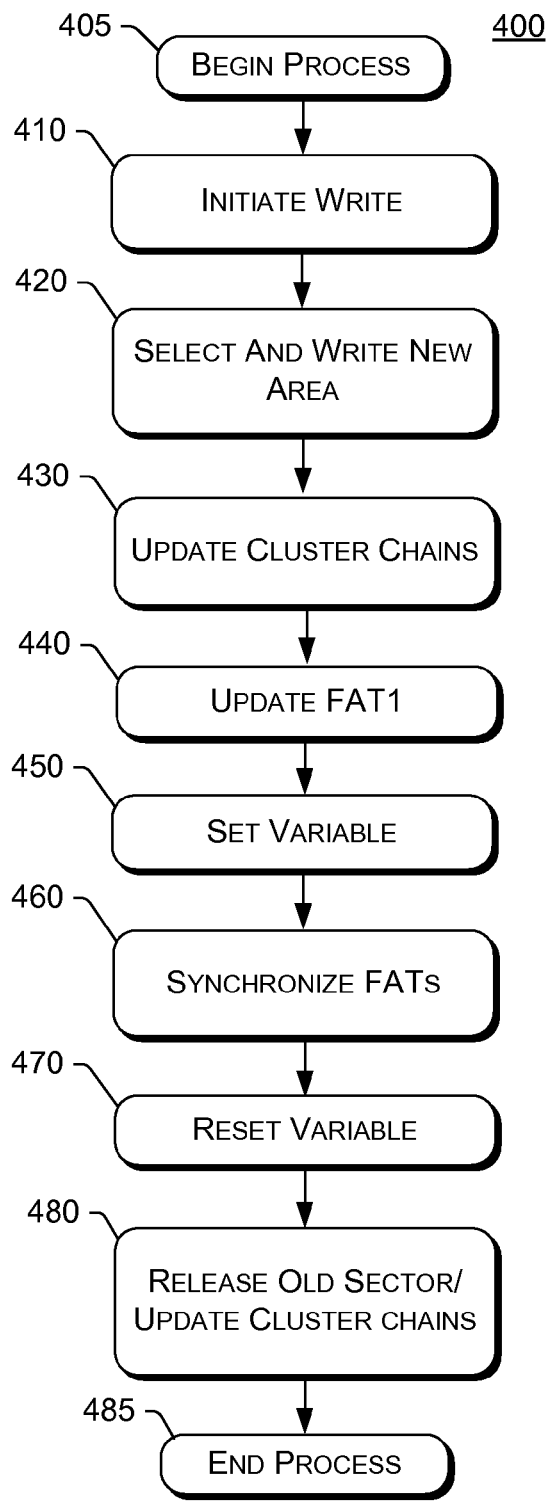
FIG. 4 is a flowchart of an exemplary process for writing data to the non-volatile memory of FIG. 1A that includes the TFAT file system of FIG. 2.

FIG. 4 is a flowchart of an exemplary process 400 for writing data to the non-volatile memory 138 of FIG. 1A that includes the TFAT file system 200 of FIG. 2. In one embodiment, one or more computer readable media (e.g., 138, FIG. 1A) have stored thereon a plurality of instructions that, when executed by one or more processors (e.g., 110, FIG. 1A), causes the one or more processors to modify data represented by at least a first sector on the non-volatile storage medium such that the one or more processors perform acts to effect the process 400. The process 400 begins in a block 405.

In block 410, an application initiates a write operation to write data to the volume.

In block 420, the write triggers the memory manager 130 of FIG. 1A to write a new sector of the medium via block drivers. In one embodiment, the application writes a new sector of the storage medium via an atomic block write. In one embodiment, the memory manager 130 of FIG. 1A writes the new sector in response to an instruction to close the file. Writing data to modify a file to a new sector preserves all old data because the sector containing the old data is not overwritten by the new data.

In block 430, cluster chains are updated.

In block 440, used/unused sector information are written in FAT1 (216, FIG. 2). In one embodiment, the processor 100 enters file allocation data including data describing the new sector in a first file allocation table.

In block 450, a variable is set to a first value. In one embodiment, the variable is set to a first value configured to block access to the storage medium by first types of file systems and configured to permit access to the storage medium by second types of file systems, such as the TFAT described in this disclosure. In one embodiment, the first types of file systems may include FAT12, FAT16 or FAT32. In one embodiment, the first value disables conventional file systems from accessing the storage medium. In one embodiment, the variable corresponds to a number of FATs (NOF) field located in the boot sector of the volume.

In block 460, the FAT1 is copied to the FAT0 (214, FIG. 2). This synchronizes FAT1 and FAT0.

In block 470, the variable is reset to a second value. The second value indicates to a TFAT file system that the FAT0 is a last known good FAT. In one embodiment, the second value also enables conventional file systems to access the storage medium. In one embodiment, resetting the variable to a second value permits access to the storage medium by the first and second types of file systems.

In block 480, the clusters corresponding to the previous version of the newly-written data are "unfrozen", that is, are marked as unallocated chains. The previous version of the file is thus recoverable until such time as the new data have been written, the FAT1 has been updated and FAT1 and FAT0 have been synchronized.

The process 400 then ends in a block 485.

In one embodiment, the variable of block 450 represents a number of FATs (NOF) field. In one embodiment, the first value for the variable is zero and the second value for the variable is two.

In one embodiment, the first two cluster entries of the second FAT table are reserved. All the bits in the second cluster entry are, by default, set to 1. When one of the highest two bits of the second cluster entry is set to 0, conventional desktop computers are likely to be triggered to perform a scandisk utility operation when the operating system is booted. However, it does not trigger any activity when the storage device is inserted and mounted.

This embodiment works well for hard-drive type media because a power failure in hard drive during a write operation can corrupt a sector being written. Because there are two FAT tables, the other FAT table is still available when one of the FAT tables is corrupted, assuming that the block driver will return a read error if the sector is corrupted during a write operation.

Figure 5:
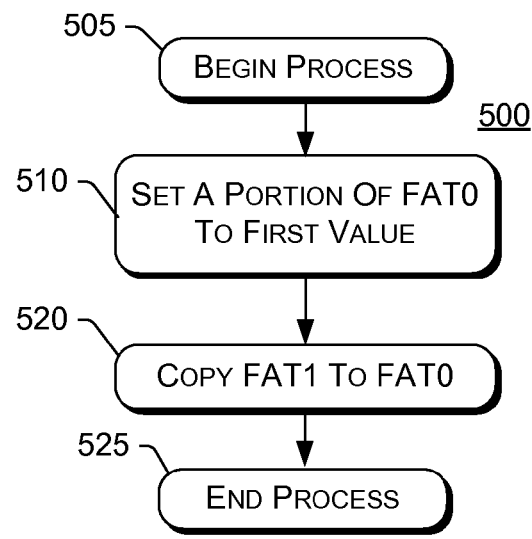
FIG. 5 is a flowchart of an exemplary process for synchronizing TFAT volumes in the TFAT file system of FIG. 2.

At end of each transaction, FAT1 is copied to FAT0 by a process described below with reference to an exemplary process 500 as shown in the flowchart of FIG. 5.

FIG. 5 is a flowchart of an exemplary process 500 for synchronizing TFAT volumes in the TFAT file system 200 of FIG. 2. The process 500 may be implemented by the processor 110 of FIG. 1A, for example, and begins in a block 505.

In block 510, the second cluster entry in FAT0 is set to a first value. In one embodiment, the first value is zero.

In block 520, FAT1 is copied to FAT0, resetting the second cluster entry to a second value. The first sector is copied last. In one embodiment, the second cluster entry is set to all ones. The process 500 then ends in a block 525.

Figure 6:
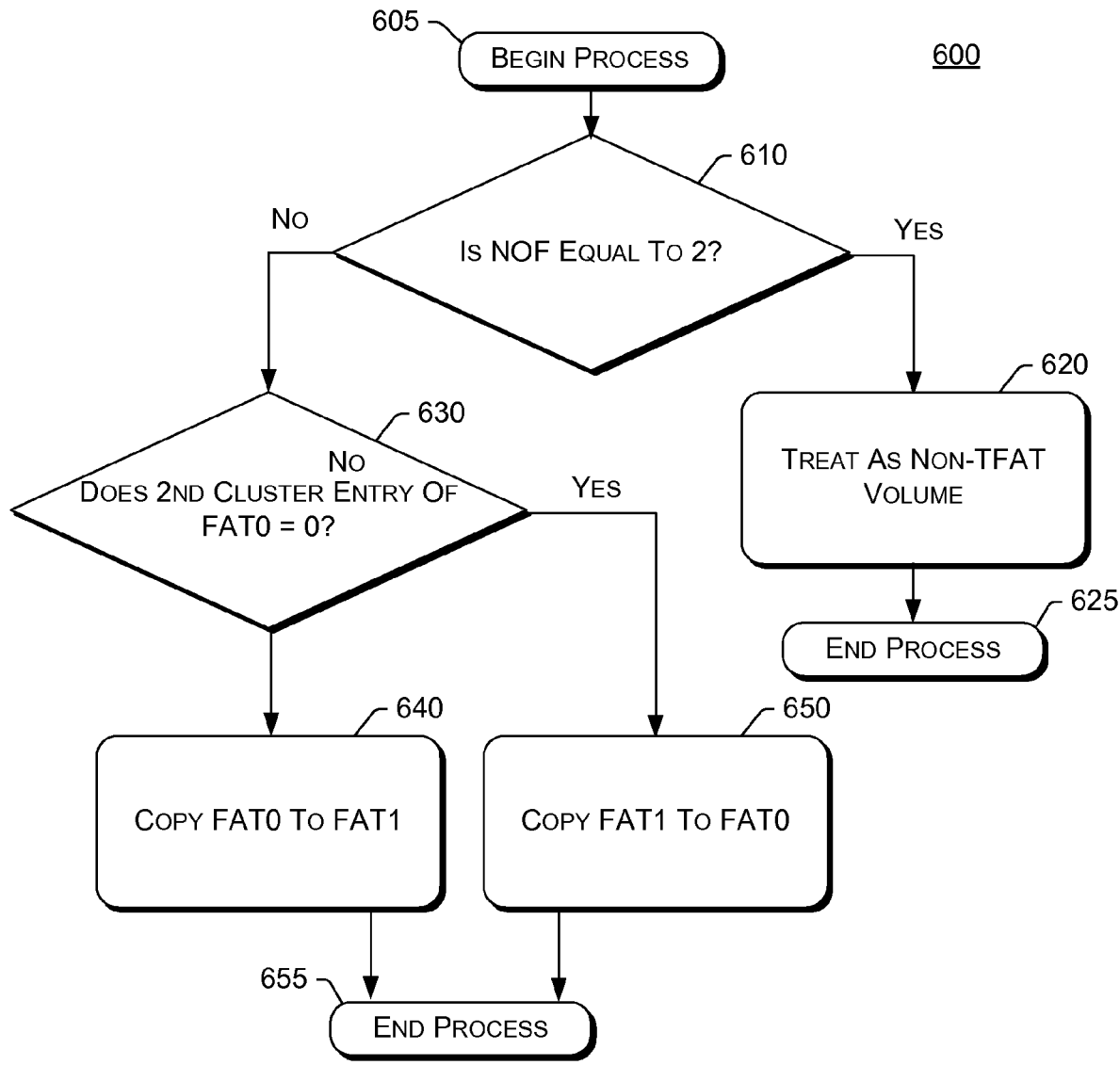
FIG. 6 is a flowchart of an exemplary process for identification of TFAT volumes and to determine which TFAT is the last known good FAT when a volume of non-volatile memory is mounted a system such as the computer system of FIG. 1A.

FIG. 6 is a flowchart of an exemplary process 600 for identification of TFAT volumes and to determine which FAT is the last known good FAT when a volume of non-volatile memory 138 is mounted in a system such as the computer system 100 of FIG. 1A. The process 600 may be implemented by the processor 110 of FIG. 1A, for example. The process 600 begins in a block 605.

In a query task 610, the process 600 determines a value for a number of FATs. When query task 610 determines that NOF is set to 2, the process 600 treats that volume as a non-TFAT volume. In block 620, the process 600 selects FAT0 as the last known good FAT and treats the volume as a non-FAT volume. The process 600 then ends in a block 625. When query task 610 determines that NOF is not 2, control passes to query task 630.

When query task 630 determines that the second cluster entry of FAT0 is not 0, the process 600 treats that volume as a TFAT volume. In block 640, FAT0 is copied to FAT1. The process 600 then ends. When query task 630 determines that the second cluster entry of FAT0 is 0 or determines that the sector-read on the first sector of the FAT0 failed, control passes to block 650.

In block 650, FAT1 is copied to FAT0. The process 600 then ends in a block 655.

In one embodiment, TFAT includes a registry setting to allow selection between setting NOF to first and second values or second cluster entry values in FAT0 to identify TFAT media and to determine which FAT to employ.

In one embodiment, this registry setting is bit 0x40000 in the "Flags" value of the conventional FAT registry key ("0x" signifies that the number is hexadecimal, i.e., base 16). When this bit is set, TFAT uses the second cluster entry in FAT0 for last known good FAT determination.

In one embodiment, access to the storage medium via conventional file systems is blocked by setting a bit on the storage medium to a value that corresponds to an indication of a defective storage medium.

In one embodiment, the TFAT control module 160 of FIG. 1B causes the FATs, and possibly also the directory file, to be re-written for every file system write. A series of small file system writes compromises system performance because each write to the storage medium is transacted and the TFAT is updated for each of these write operations.

Figure 7A:
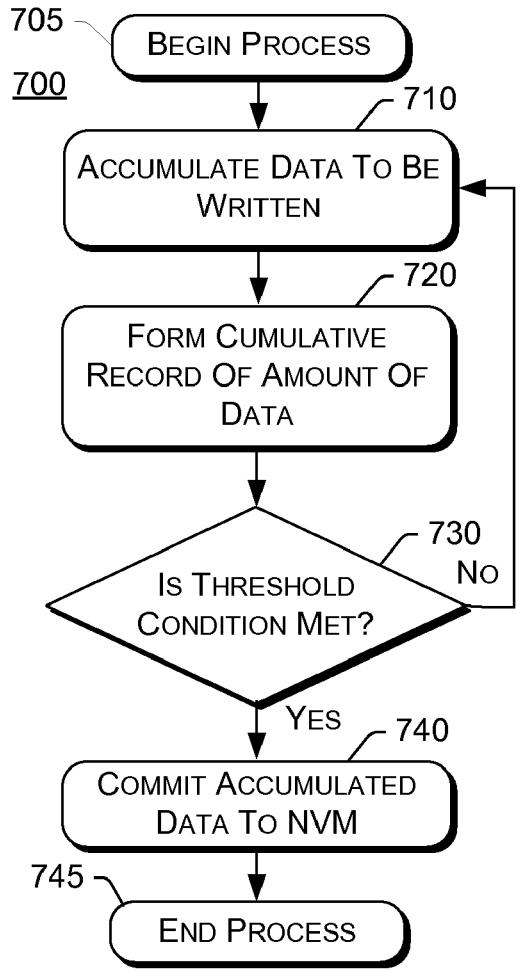
FIGS. 7A and 7B are flowcharts of exemplary processes for writing data to non-volatile storage media using the TFAT file system of FIG. 2.

FIG. 7A is a flowchart of a process 700 for determining when to write data to non-volatile storage media (e.g., 138, FIG. 1A) using the TFAT file system 200 of FIG. 2. The process 700 may be implemented by the processor 110 of FIG. 1A, for example, and begins in a block 705.

The process 700 then, in a block 710, accumulates (e.g., in RAM 136) data to be written from a plurality of instructions to write data to the storage medium 138. In a block 720, a cumulative record of an amount of data to be written is maintained.

A query task 730 tests for presence of a first predetermined threshold condition. In one embodiment, the threshold condition is met at the time when the file is closed. In one embodiment, the threshold condition is met when a predetermined or adjustable amount of data to be written has been accumulated. When the amount of accumulated data is less than the predetermined threshold, control passes back to block 710 to await further write data commands.

When the query task 730 determines that the predetermined threshold condition has been met, the process 700 causes the processor 110 of FIG. 1A to write the accumulated data to the storage medium 138 (block 740). The process 700 then ends in a block 745.

In one embodiment, the "Delayed Commit" feature allows flexibility to choose whether to commit FAT tables at the time the file is closed or not. In one embodiment, the TFAT control module 160 of FIG. 1B causes the application to merge several small writes into one single one.

However, because a write can fail if there is not enough free storage space in the storage medium, storing very large data blocks (>500 KB) in one single write can result in failure. In order to avoid such write failure, the TFAT control module 160 finds enough free sectors in the volume of storage medium to be able to write a new sector for each sector of data to be written or modified.

Accordingly, in one embodiment, the TFAT control module 160 determines amounts of data to be written in response to individual write commands and accumulates these data until a predetermined threshold quantity of data to be written is achieved. In one embodiment, the threshold may be adjustable as a function of the amount of available storage on the storage medium as that amount fluctuates. In other words, when the amount of unallocated storage medium is small, the threshold may be reduced or smaller, while when the amount of unallocated storage medium is relatively large (at least compared to the amount of storage medium required for each write), the threshold may be increased or larger.

In one embodiment, an intermediate TFAT is created in volatile memory to keep track of the non-volatile memory write operations to be carried out, either at when the file is closed or when the predetermined threshold is achieved. The intermediate TFAT is maintained at least until the FAT1 is updated.

In one embodiment, when a single block of data needs to be modified, the TFAT file system first reads the existing disk block into a system buffer. The TFAT file system then finds and allocates a new cluster on disk. The TFAT is then traversed to find any entries corresponding to the old cluster, and the new cluster is relinked to replace such. This completes the FAT chain modifications. Then the system buffer is "renamed" to correspond to the newly allocated cluster on disk. In one embodiment, it is also marked as "dirty," which causes the system buffer to be written out to disk when the buffer is ever released (avoiding having to perform an immediate and duplicate write; the TFAT control module 160 can modify the buffer, and then write it all out to non-volatile storage at once).

In another aspect, the TFAT system 200 of FIG. 2 can work with a write-back cache memory by flushing the cache memory when the data stored in the cache memory are written or committed to non-volatile memory. In other words, a flushing mechanism has been added to allow the TFAT file system 200 of FIG. 2 to flush a cache memory during the commit transaction process. For example, a write-back cache marks all sector writes that come to the cache memory as dirty, and then writes those dirty sectors to non-volatile memory, such as a flash memory or disk, at a later time, following which the portions of the cache memory are "flushed" or freed for other uses. In order for TFAT to operate effectively, a control mechanism needs to regulate when these dirty sectors in the cache memory are flushed. A flush request for flushing the cache memory is passed to the block driver, to ensure that any buffering that the block driver device is doing has been flushed. The commit transactions process 750 works as described below with respect to FIG. 7B.

Figure 7B:
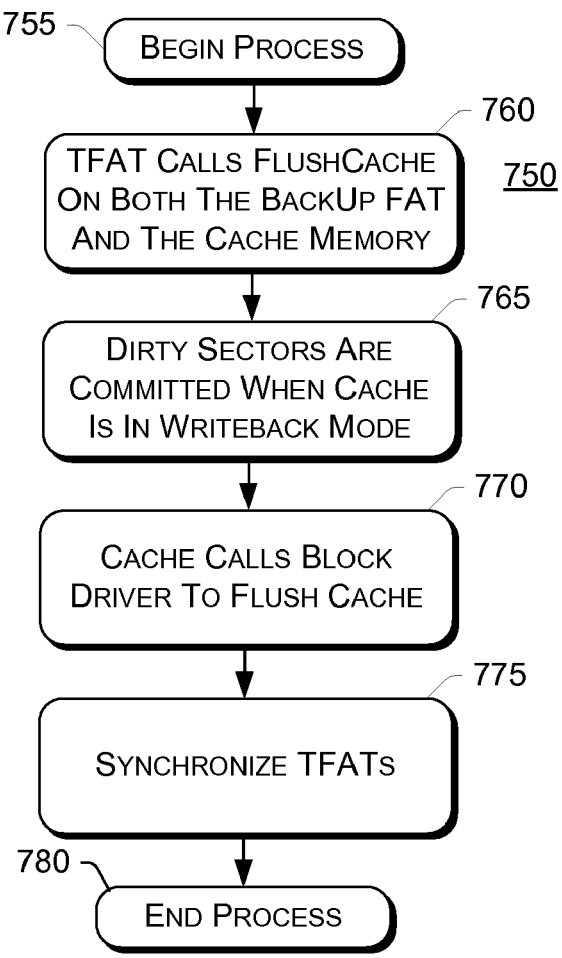

FIG. 7B is a flowchart describing the process 750 for cache memory operation in a TFAT system 200. The process 750 begins in a block 755.

In a block 760, the process 750 calls a flush-cache instruction that acts on both the cache memory (e.g., the cache memory 112 of FIG. 1) and the TFAT files. The cache memory contains data in sectors that have been marked as being "dirty".

In a block 765, the process 750 writes the "dirty" sectors to non-volatile memory.

In a block 770, the cache memory calls a block driver device to flush these "dirty" sectors. This to ensures that any buffering that the block driver device is doing has also been flushed.

In a block 775, the FATs are synchronized to reflect the data that have been written to the non-volatile memory. The process 750 then ends.

In one embodiment, a WriteFileGather function allows multiple discontinuous pages to be written to discontinuous locations of a file. In TFAT, this can be done in an atomic fashion if the file is open in write-though mode. This may be used to flush multiple pages of data to various locations in a file all in one atomic operation.

In one embodiment, the approach taken is slightly different. WriteFile can write an arbitrary amount of data to an arbitrary location in a file. In one embodiment, a stream process is used to clone streams.

When there is an attempt to write to an existing part of a stream, this embodiment attempts to allocate enough space for the entire write, or uses the most contiguous space available. Since stream-based operations operate on "runs" (e.g., contiguous blocks of data on storage media such as disks), cloning is performed in the same fashion. An unallocated run of appropriate length is located, and this is termed a "parallel run". For example, if data in a run corresponded to sectors 51-55, a parallel run might be 72-76.

After a parallel run has been allocated, it is linked in to the existing FAT chain for the file, and the stream's current run information is updated with this new information. The rest of the function call proceeds conventionally, except instead of writing to the old run of the file, data are written to the new, parallel run, and the original copy of the run is preserved on the storage medium. This only occurs for data composed of block-sized chunks of data that are block-aligned.

Thus, before any data is written to storage media such as disks, the portion to be written to is reallocated, and the structures updated, so the writes occur to new clusters. When a stream needs to be expanded (i.e., the write is occurring past EOF, the end of the file), then these new clusters are not cloned; there is no backup to preserve.

The strategy outlined by example with respect to processes 300-700 maintains a backup of the most recent "good" version of the FAT in case power is lost during sector writing or FAT updating. In one embodiment, when a power-on reset occurs, NOF=0 means that TFAT file systems will use FAT1 as the valid or last known good FAT; while NOF=2 means that TFAT file systems will use FAT0 as the valid FAT and similarly that desktop-compatible file systems should be able to use FAT0.

This embodiment allows compatibility with existing desktop systems (that do not comprehend TFAT) when a transaction has been completed and the NOF flag=0. It also prevents such a conventional desktop system from reading the volume when power has been lost in mid-transaction, i.e., after the NOF field was set to two but prior to updating of FAT0 and/or resetting of the NOF field.

TFAT can be incorporated in and operate on all sorts of physical storage media. Non-removable media include NAND/NOR flash memory and hard drives. Removable media include Compact-Flash (CF) cards, Secure-Digital (SD) cards, floppy discs and other removable mass storage devices.

In one embodiment, a block driver module associated with the physical mass storage device employs atomic block write operations. In one embodiment, block size equals sector size, e.g., 512 bytes. In one embodiment, TFAT supports any block driver that does atomic sector-size (512 bytes) disk I/O operation.

As used herein, "atomic" means that if a failure happens (due to power cycle or media removal) during a sector-sized write-operation, a read-operation on the same sector at a later time can only have the following three results:
1. Read returns old sector data.
2. Read returns new sector data.
3. Read returns failure.

For some types of NAND-flash media, only the first two results are possible. For hard-drive type media, all three results are possible. For general media and other types of block write module, at least one other possible outcome is that the read operation returns corrupted data. TFAT supports at least those systems and media where atomic block write operations are employed. In one embodiment, TFAT supports media employing transacted block modules.

Because the TFAT file system writes an entire new sector or file when data are modified in any file, TFAT may be slower than conventional FAT file systems. A system employing TFAT may be, for example, 2.5 to 1.05 times slower than a conventional FAT file system. In one embodiment, this ratio can be lowered by committing the write to the TFAT control module 160 when the file is closed instead of with every write to the file.

Figure 8A:
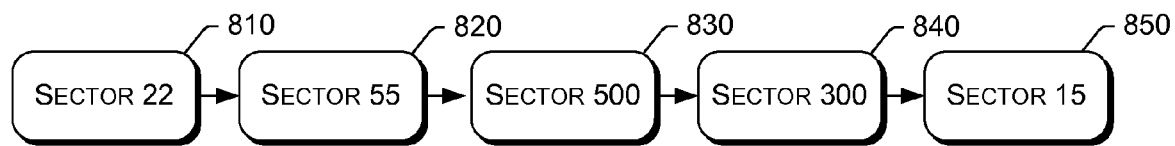
FIGS. 8A and 8B are block diagrams showing relationships between sectors forming an exemplary FAT chain for a given file, before and after a write operation.
Figure 8B:
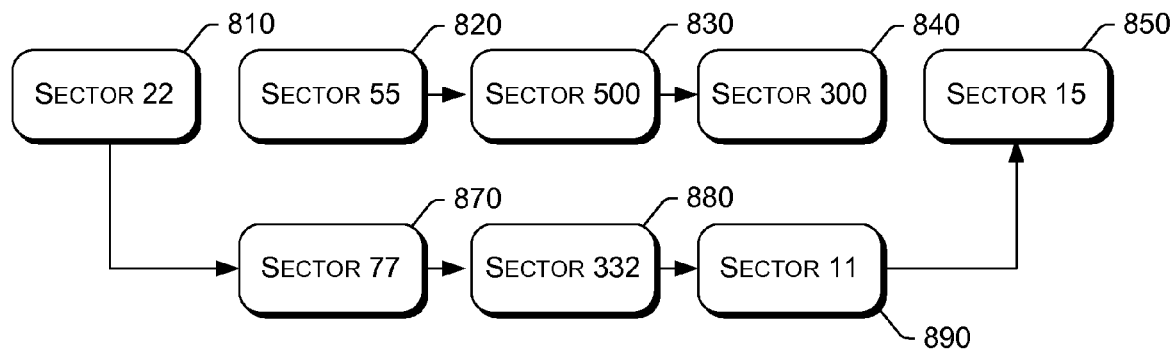

FIGS. 8A and 8B are block diagrams showing relationships between sectors forming a FAT chain for a given file, before and after a write operation. FIG. 8A illustrates a portion 800 of a hypothetical FAT chain for the file prior to a write operation. The portion 800 includes sector 22 (block 810), sector 55 (block 820), sector 500 (block 830), sector 300 (block 840) and sector 15 (block 850). FIG. 8B illustrates a portion 860 of the hypothetical FAT chain after the write operation, which updates the data contained in blocks 820, 820 and 840, but which does not modify the data contained in those blocks. Instead, sector 77 (block 870), sector 332 (block 880) and sector 11 (block 890) are allocated and written, and the FAT chain is updated to reflect the new file structure. In the event that the write process is interrupted by a power failure or other system disturbance, the data contained in the file prior to the write (blocks 810-850) are uncorrupted and thus are recoverable.

Figure 9:
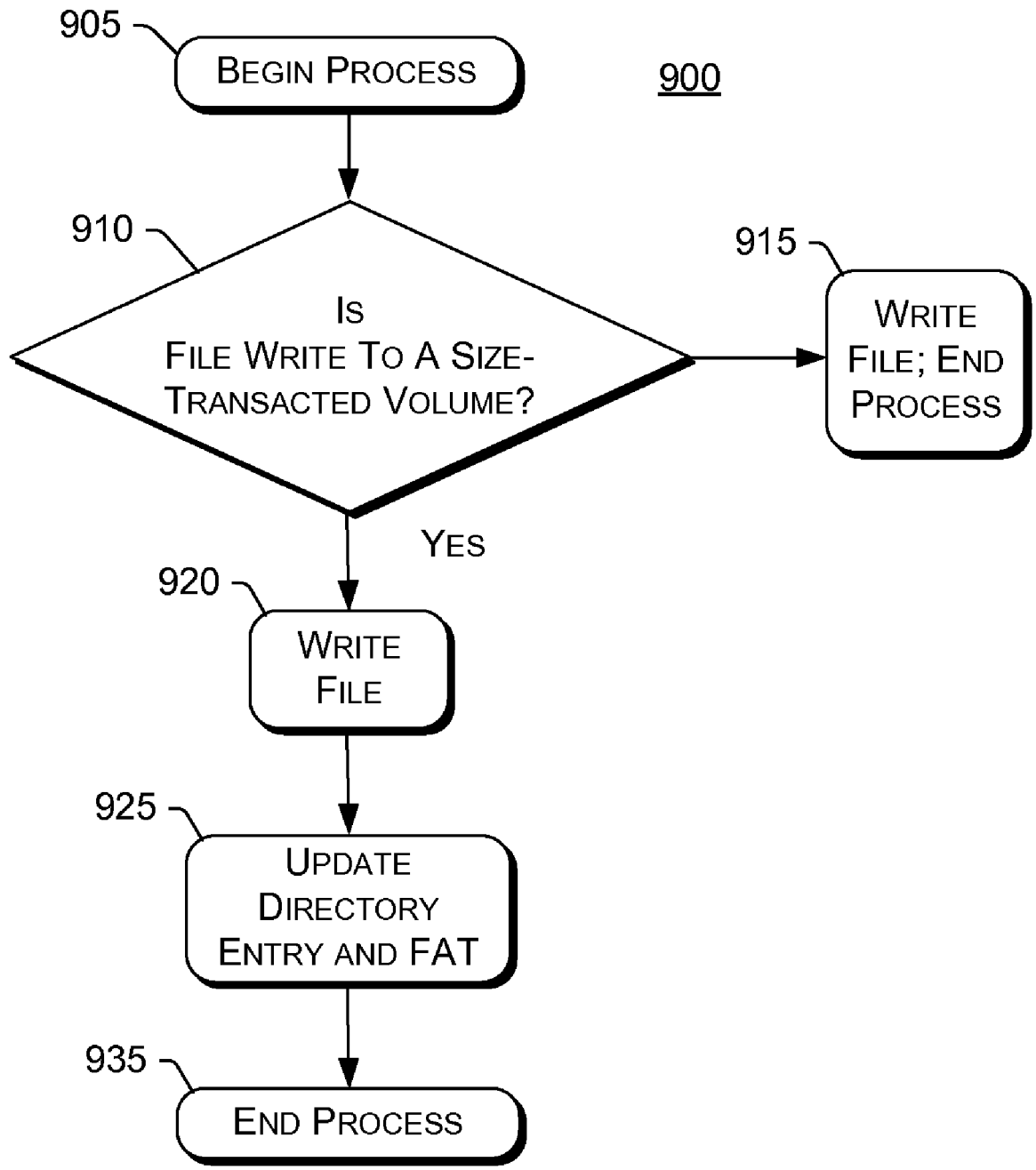
FIG. 9 is a flowchart of a process for making file size transaction safe.

Making the file size transaction safe is also a desirable feature, that is, adding the ability to make any change in file size by extending or shrinking the size of a file in a transaction-safe manner. FIG. 9 is a flowchart of a process 900 for making file size transaction safe. The process 900 begins in a block 905 with a write event.

In a query task 910, the process 900 determines when it is desired to make the file size transaction safe. In one embodiment, this is determined when the write is to a volume in which the file size is made transaction safe.

When the query task 910 determines that the file size need not be transaction safe, control passes to a block 915. In the block 915, the file write is transacted, but the file size is not made transaction safe (e.g., as described above), and the process 900 then ends.

When the query task 910 determines that the file size is to be transaction safe, control passes to a block 920.

In the block 920, the file contents (data) are written to the volume. The file contents may be written to the volume by transacting an atomic memory write to non-volatile memory media. Control then passes to a block 925. In the block 925, the FAT is updated, and the file size is transacted. In other words, the size of a file is stored in the directory entry for that file, so the directory entry has to be transacted. The process 900 then ends in a block 930.

As a result, when power is lost during the middle of extending or shrinking a file using the process 900, the file size recorded in the FAT is either the original size or the new size, and is not some size that is in between these two sizes. This also tends to impact performance, because additional data need to be handled via the TFAT system. As a result, making file size transaction safe is done when the TFAT volume is specifically configured to make file size data transaction safe.

Figure 10:
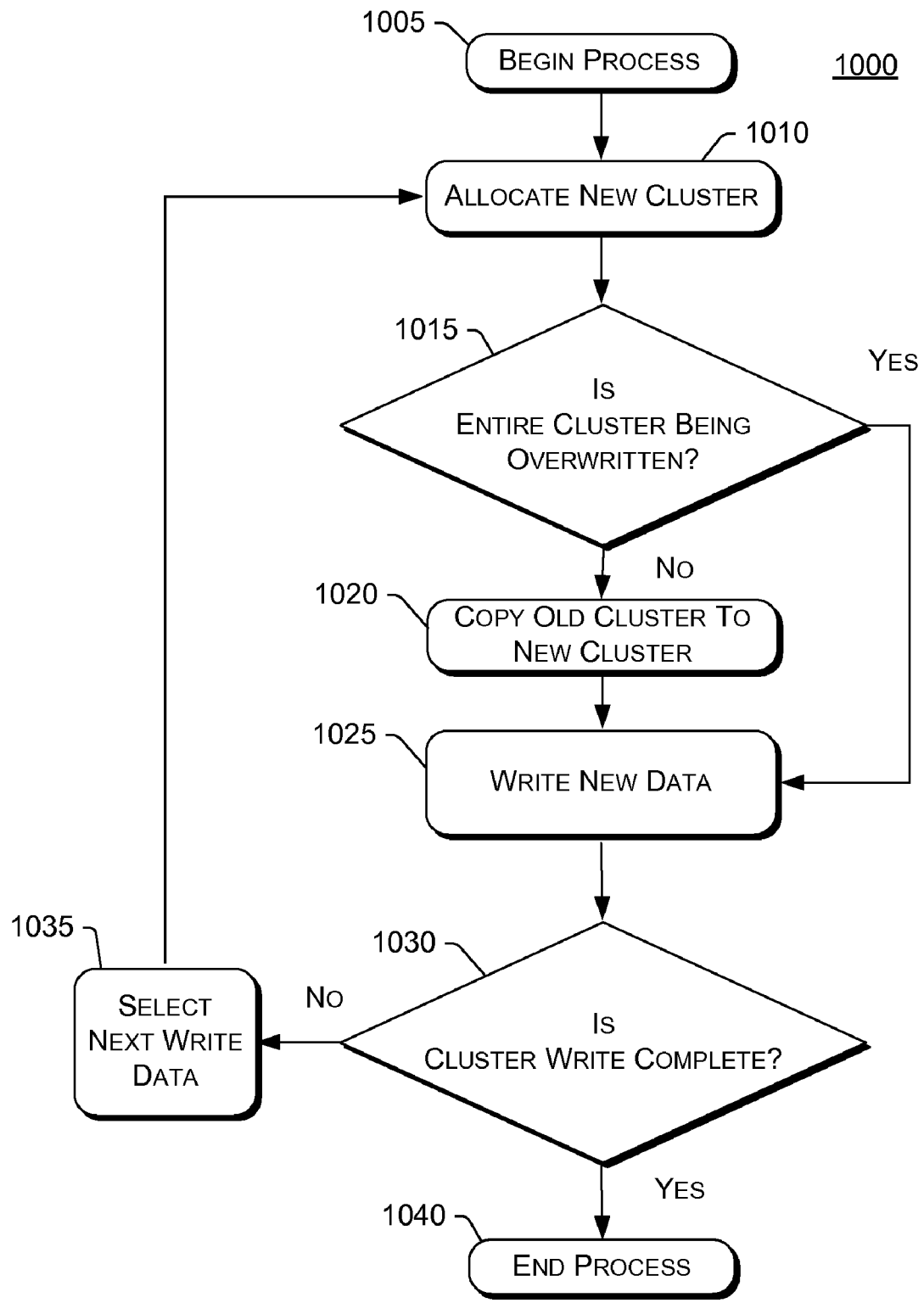
FIG. 10 is a flowchart of an exemplary process for writing a new cluster in the TFAT file system of FIG. 2, whereby a conventional TFAT copy cluster is not done when new data will replace/overwrite the existing data.

FIG. 10 is a flowchart of an exemplary process 1000 for writing a new cluster in the TFAT file system 200 of FIG. 2, whereby a conventional TFAT copy cluster is not done when new data will replace/overwrite the existing data. The process 1000 begins in a block 1005.

In a block 1010, the process 1000 a new cluster is allocated. Control then passes to a query task 1015.

In the query task 1015, the process 1000 determines when the new cluster represents a revision of an existing cluster. When the query task 1010 determines that the new cluster does not represent an over-write of an entire existing cluster, control passes to a block 1020. When the query task 1010 determines that the new cluster does represent an over-write of an existing cluster, control passes to a block 1025.

In the block 1020, the old cluster of data is copied to the cluster that was allocated in the block 1010. This corresponds to conventional TFAT cluster writing. Control then passes to the block 1025.

In the block 1025, the new cluster data are written to the cluster allocated in the block 1010. Control then passes to a query task 1030.

In the query task 1030, the process 1000 determines when further data are to be written. When the query task 1030 determines that additional clusters of data are to be written, control passes to a block 1035.

In the block 1035, a next cluster of data to be written is selected. Control then passes back to the block 1010, and the process 1000 iterates. When the query task 1030 determines that no additional clusters of data are to be written, the process 1000 ends in a block 1040.

The TFAT discussed herein has been described in part in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

For purposes of illustration, programs and other executable program components such as the file system are illustrated herein as discrete blocks, although it is recognized that such programs and components reside at various times in different storage components of the computer, and are executed by the data processor(s) of the computer.

Alternatively, TFAT may be implemented in hardware or a combination of hardware, software, and/or firmware. For example, one or more application specific integrated circuits (ASICs) could be designed or programmed to carry out aspects of the TFAT file system.

Although TFAT has been described in language specific to structural features and/or methodological steps, it is to be understood that the recitation in the appended claims is not necessarily limited to the specific features or steps described. Rather, the specific features and steps are disclosed as preferred forms of implementing the claimed subject matter.

What is claimed is:

1. One or more computer readable storage media having stored thereon instructions that, when executed by one or more processors, cause the one or more processors to locate data by performing acts including:
   receiving a request to locate data in a non-volatile memory having a transaction-safe file allocation table (TFAT) file management system;
   selecting a sector of the memory to parse to locate the data;
   determining when the selected sector is a first sector of a directory or subdirectory of the memory; and
   when determining reveals that the selected sector is the first sector, skipping reading data from the selected sector.

2. The one or more computer readable storage media of claim 1, wherein the instructions to cause the one or more processors to locate data comprise instructions to locate data stored in a solid state non-volatile memory.

3. The one or more computer readable storage media of claim 1, wherein, when determining reveals the selected sector is not the first sector, reading information from the selected sector to compare to search criteria.

4. The one or more computer readable storage media of claim 1, wherein, when determining reveals that the selected sector is the first sector, selecting another sector and iterating determining when the another selected sector is another first sector of a directory or subdirectory of the memory; and
   when determining reveals that the another selected sector is the another first sector, skipping reading data from the another selected sector.

5. The one or more computer readable storage media of claim 1, further comprising, when determining reveals that the selected sector is the first sector, incrementing to another sector.

6. A process performed at least in part by a computer, the process comprising:
   receiving a request to locate data in a non-volatile memory having a transaction-safe file allocation table (TFAT)file management system;
   selecting a sector of the non-volatile memory to parse to locate the data;
   determining if the selected sector is a first sector of a directory or subdirectory of the non-volatile memory; and
   when determining reveals that the selected sector is the first sector, skipping reading data from the selected sector.

7. The process of claim 6, further comprising locating the data within the non-volatile memory.

8. The process of claim 6, further comprising reading information from the selected sector to compare to search criteria when the determining reveals that the selected sector is not the first sector.

9. The process of claim 6, wherein:
   when the determining reveals that the selected sector is the first sector, selecting another sector and determining if the another sector is another first sector of a directory or subdirectory of the memory; and
   when the determining reveals that the another sector is the another first sector, skipping reading data from the another sector.

10. The process of claim 6, further comprising incrementing to another sector when the determining reveals that the selected sector is the first sector.

11. The process of claim 10, further comprising:
    reading information from the another sector to compare to search criteria; and
    returning a message when the comparison reveals that the data has been located within the another sector.

12. The process of claim 10, further comprising determining if the another sector is a last sector to be searched.

13. The process of claim 12, further comprising returning a message in accordance with determining that the another sector is the last sector be searched.

14. A system comprising one or more processors configured to:
    receive a request to locate data within a non-volatile memory having a transaction-safe file allocation table (TFAT) file management system;
    select a sector of the non-volatile memory to parse to locate the data;
    determine if the selected sector is a first sector of a directory or subdirectory of the non-volatile memory and, when the determination reveals that the selected sector is the first sector, skip reading data from the selected sector.

15. The system of claim 14, the one or more processors further configured to locate the data within the non-volatile memory.

16. The system of claim 14, the one or more processors further configured to:
    read information from the selected sector when the determination reveals the selected sector is not the first sector; and
    compare the information to search criteria to determine if the data is located within the selected sector.

17. The system of claim 14, the one or more processors further configured to:

select another sector of the non-volatile memory in response to determining that the selected sector is the first sector;
determine if the another sector is another first sector of a directory or subdirectory of the non-volatile memory; and
skip reading data from the another sector in response to determining that the another sector is the another first sector.

18. The system of claim 17, the one or more processors further configured to:
read information from the another sector in response to determining that the another sector is not the first sector;
compare the information to search criteria; and
returning a message when the comparison reveals that the data has been located within the another sector.

19. The system of claim 17, the one or more processors further configured to determine if the another sector is a last sector to be searched.

20. The system of claim 19, the one or more processors further configured to return a message in accordance with determining that the another sector is the last sector be searched.

* * * * *